United States Patent [19]

Beaucoup et al.

[11] Patent Number: 4,943,020
[45] Date of Patent: Jul. 24, 1990

[54] MANIPULATOR APPARATUS

[75] Inventors: Louis Beaucoup; Jean Boncompain, both of Saint Etienne; Jean-Claude Reynaud, Manosque, all of France

[73] Assignee: Schlumberger Technologies, Inc., San Jose, Calif.

[21] Appl. No.: 242,780

[22] Filed: Sep. 9, 1988

[30] Foreign Application Priority Data

Sep. 17, 1987 [FR] France ............................... 87 13098
Sep. 17, 1987 [FR] France ............................... 87 13099

[51] Int. Cl.$^5$ .............................................. A47G 29/00
[52] U.S. Cl. ................................. 248/124; 248/123.1; 248/280.1; 414/590
[58] Field of Search ............... 248/124, 279, 280.1, 248/281.1, 651, DIG. 4, 162.1, 106, 123.1; 414/590, 744.7; 901/48, 17, 18

[56] References Cited

U.S. PATENT DOCUMENTS

| | | | |
|---|---|---|---|
| 2,092,336 | 9/1937 | Schauer | 77/26 |
| 2,168,209 | 8/1939 | Haupt | 248/572 X |
| 3,478,436 | 11/1969 | Barnes | |
| 3,575,368 | 4/1971 | Thomas | 248/647 X |
| 3,805,629 | 4/1974 | Martin et al. | 248/188.4 X |
| 4,132,318 | 1/1979 | Wang et al. | 901/9 X |
| 4,229,136 | 10/1980 | Panissidi | 901/9 X |
| 4,383,455 | 5/1983 | Tuda et al. | 248/123.1 X |
| 4,548,373 | 10/1985 | Komura | 248/122 |

FOREIGN PATENT DOCUMENTS

| | | |
|---|---|---|
| 2225408 | 10/1973 | Fed. Rep. of Germany . |
| 706834 | 4/1954 | United Kingdom . |
| 2045068 | 10/1980 | United Kingdom ......... 248/124 |

*Primary Examiner*—Karen J. Chotkowski
*Attorney, Agent, or Firm*—David H. Carroll

[57] ABSTRACT

A manipulator apparatus for supporting and orienting the test head (11) of an automatic test equipment. A column assembly (14) has a sheath (26) which moves vertically and which is connected via a cable to a manually adjustable counterbalancing device (41) for supporting the weight of the test head (11). A ring (54) is mounted for rotation on the sheath (26) with a side portion (63) slidably receiving an arm (64). A block (81) is mounted for rotation about a vertical axis (theta-z) at the end of arm (64). Orienting means (16) are mounted in block (81) to rotate about a horizontal axis (theta-x), the test head having a radially extending arm (12) mounted for rotation about an additional axis (theta-y). Adjustment means are disposed between block (81) and orienting means (16) to prevent the head (11) from tilting about horizontal axis (theta-x).

11 Claims, 7 Drawing Sheets

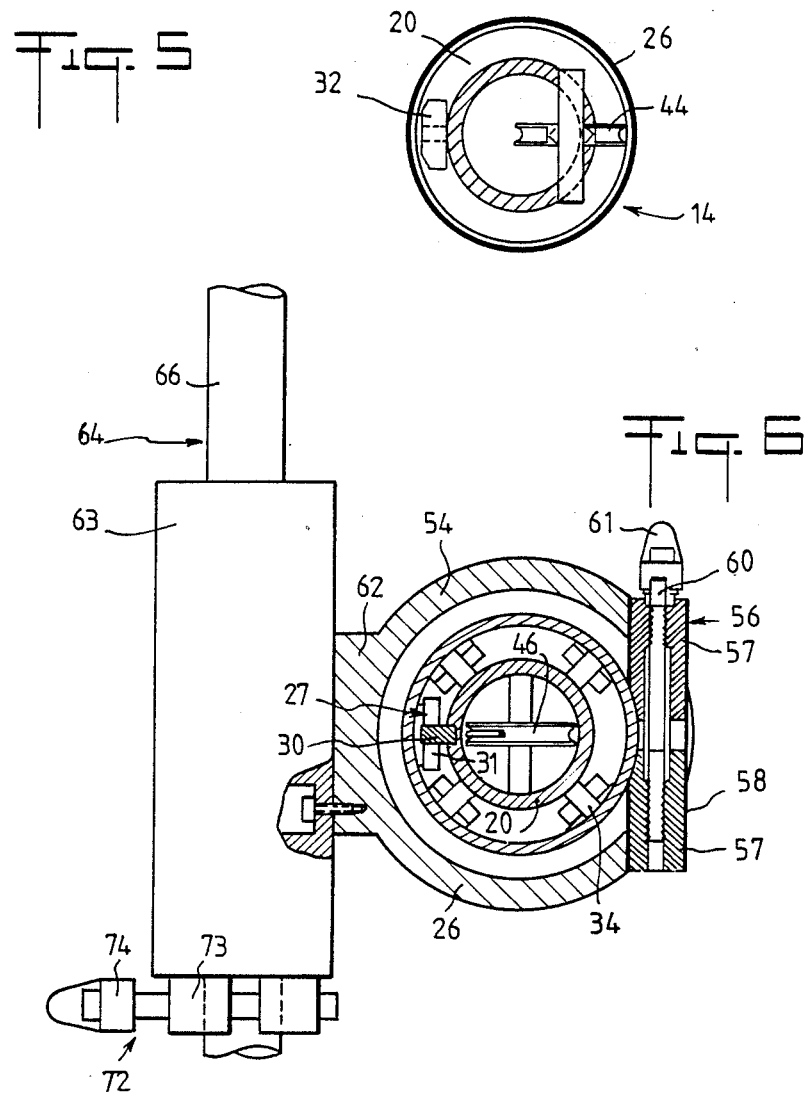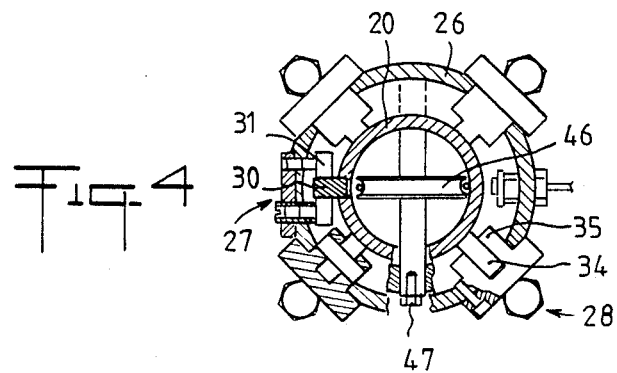

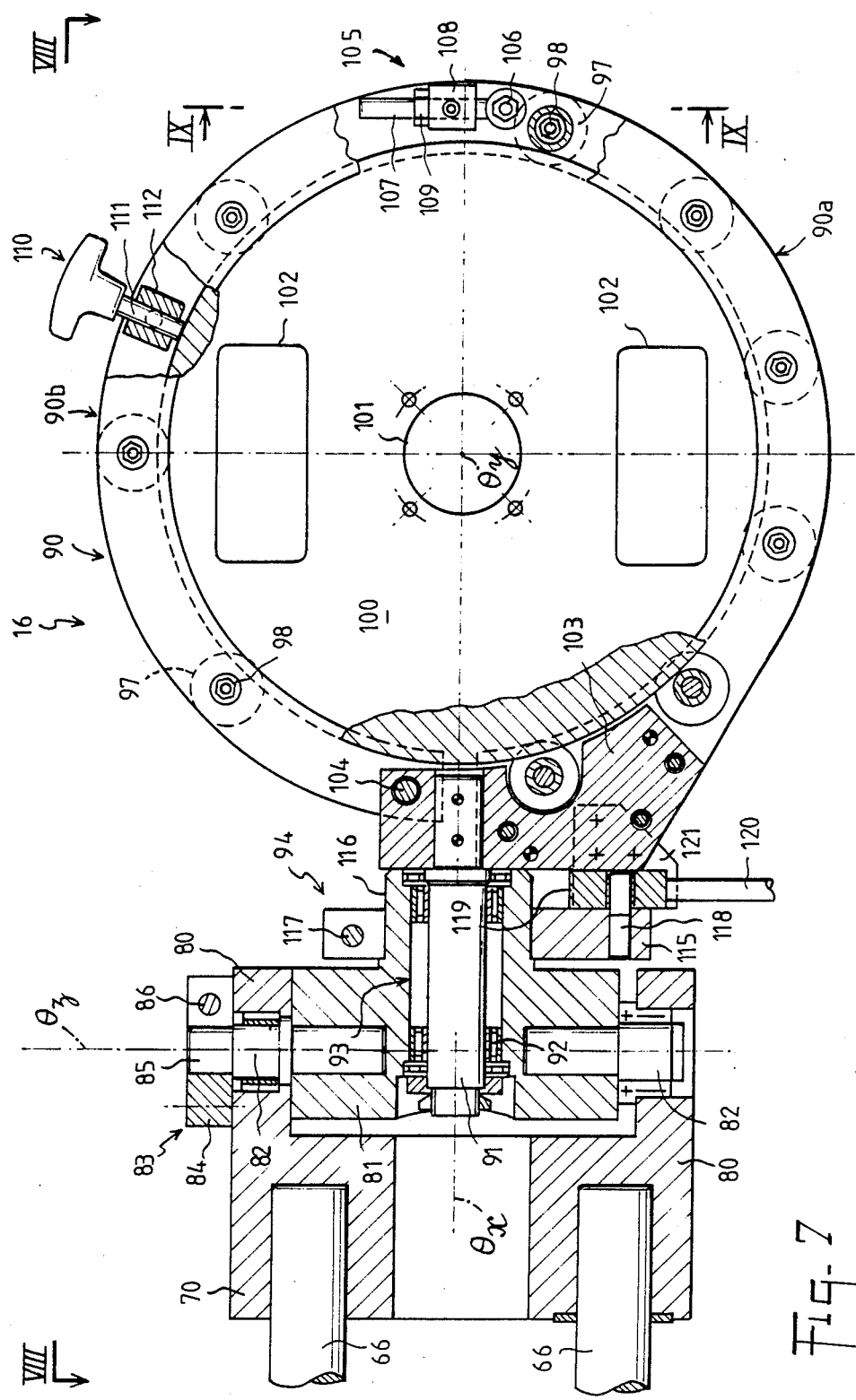

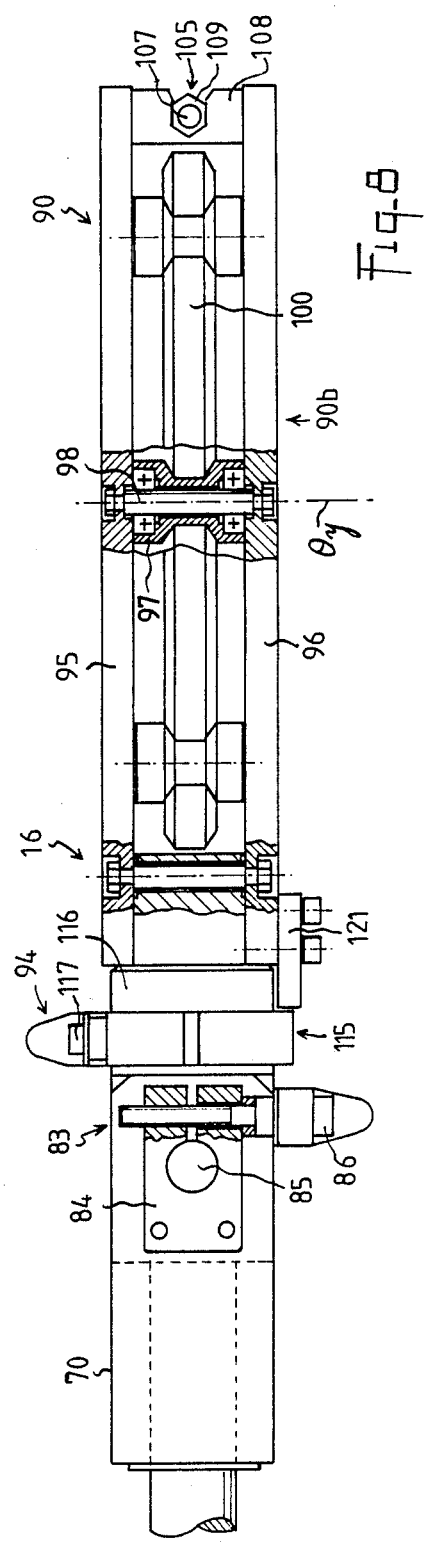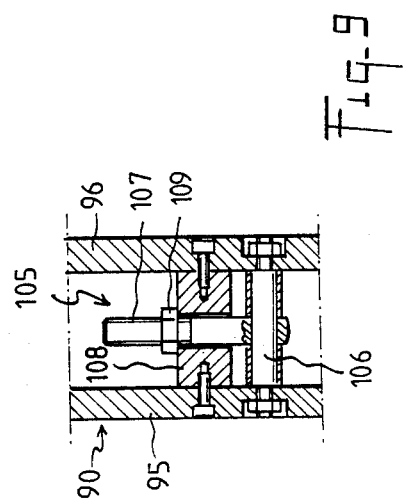

MANIPULATOR APPARATUS

BACKGROUND OF THE INVENTION

1. Field of the Invention

The present invention relates to manipulator apparatus, and more particularly to manipulator apparatus for supporting and orienting the test head of an automatic test system.

2. Description of Related Art

Manipulators are intended to enable the position in elevation, azimuth, and orientation of a heavy test head to be adjusted manually so that the test head can be engaged accurately with and docked to a device handler, which is a device that feeds the test head with electronic circuits to be tested.

Electronic test heads are heavy assemblies comprising a structure supporting and protecting a large number of driver and comparator circuits which are connected to an automatic test equipment by connection cables. Each integrated circuit to be tested is successively positioned on the test head from a device handler to which the head is docked. In general, such heads are organized in the form of approximately rectangular cases which can be carried via two stub axles fixed to two opposite sides of the case in a balanced condition since the weight of the head is distributed symmetrically about these stub axles.

Other electronic test heads which will be called here asymmetrical heads have a cylindrical case with a radially extending rigid arm, containing electrical connection cables and cooling hoses.

Known manipulator apparatus such as the one described in U.S. Pat. No. 4,589,815 (Smith) comprises a vertical column formed by a H-shaped beam. An arm assembly supporting the test head moves vertically on the vertical column. The arm assembly has two vertical axes which are needed to support the weight of the test head when the head is manually moved away from the vertical column. In the Smith manipulator, the arm assembly cannot be rotated by 360x about the vertical column. Moreover, the H-shaped beam is lengthy, since its top has to be higher than the maximum upper position of the test head. This requirement results in a heavy and bulky vertical column. A further disadvantage is the use of manually handled metallic weights which are needed to balance the weight of the test head. The metallic weights are not easy to handle and the balance cannot be adjusted continuously. Furthermore the arm assembly does not provide large horizontal displacements.

Other manipulator apparatus also described in the above-mentioned patent. One variation comprises a pressure operated counterbalancing means for vertically displacing and supporting the weight of the test head. These pressure operated means are complicated since they need a pump, a pressure regulator and preferably a damping system which have to be permanently in operation to keep a constant fluid pressure in order to balance the weight of the test head.

SUMMARY OF THE INVENTION

An object of the present invention is to provide a manipulator apparatus with a reduced vertical height.

A further object of the present invention is to provide a manipulator apparatus that permits rotation of the arm assembly over a full 360 degrees about a vertical axis.

Another object of the present invention is to provide a manipulator apparatus having a relatively simple counterbalancing system which is continuously adjustable and which does not need handling separate removable weight pieces to balance the weight of the test head.

These and other objects are obtained, according to the present invention, by a manipulator apparatus comprising a base, a first vertical structure supported by the base, a second vertical structure in engagement with the first vertical structure and moveable relative thereto along a vertical axis from a fully retracted position to a fully extended position, an object support arm connected to the second vertical structure, an adjustable force generator, and a mechanical linkage for transmitting a counterbalancing force from the force generator to the second vertical structure in opposition to the weight of the second vertical structure, the object support arm, and the object. Preferably, the first and second vertical structures are tubular columns that are telescopically and coaxially mounted about a first vertical axis. The mechanical linkage includes a cable having one end attached to the second vertical structure and the other end connected to the force generator, and a pulley system for directing the biasing force to the second vertical structure. The object support arm is rotatable about the vertical axis while the second column is constrained from rotation about the first column.

Preferably, the force generator comprises a case attached to the base; a drum rotatably mounted in the case for spooling the cable; an adjustable spring attached to the drum for applying an adjustable biasing force to the drum for spooling the cable means on the drum; and compensating means for compensating the variations of said biasing force for a range of angular positions of said drum means, so that the weight of the test head is substantially counterbalanced for a range of vertical position of said test head without changing the adjustment of the biasing force.

BRIEF DESCRIPTION OF THE DRAWINGS

In the drawings, where like reference numerals indicate like parts:

FIGS. 3, 4, 5 and 6 are plan views partially in cross section of the column assembly taken on lines III—III, IV—IV, V—V and VI—VI of FIG. 2 respectively;

FIG. 7 is a partially sectional elevation view of the orientating device of the manipulator apparatus;

FIG. 8 is a partially sectional plan view taken on line VIII—VIII of FIG. 7;

FIG. 9 is a cross-section taken on lines IX—IX of FIG. 7;

DESCRIPTION OF THE PREFERRED EMBODIMENT

Figure 1:
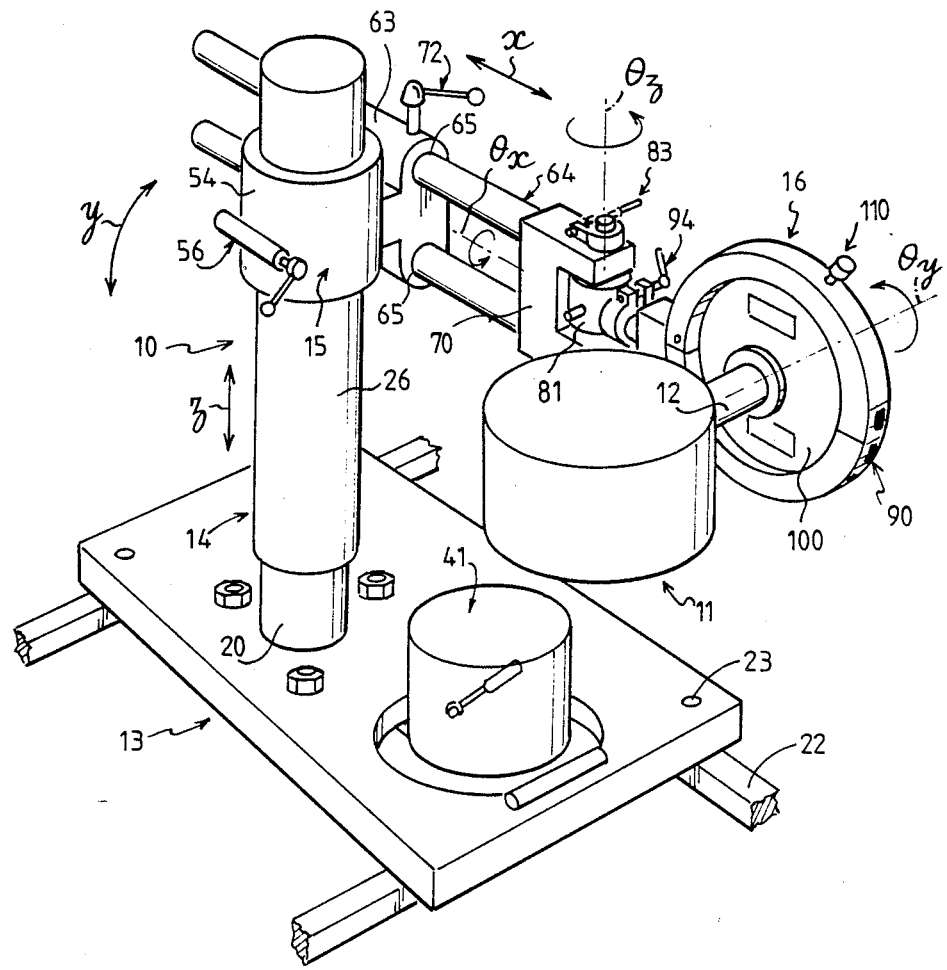
FIG. 1 is a perspective view showing a manipulator apparatus for supporting and orienting an electronic test head.

FIG. 1 is a diagram showing a manipulator apparatus 10 for supporting and orienting an electronic test head 11 of the asymmetrical type and provided with a radially extending arm 12. The manipulator 10 comprises a base plate 13 having a column assembly 14 standing thereon and provided with positioning means 15 capable of displacing head orientating means 16 in the three space dimensions x, y, and z. Positioning means 15 provides three movements for the test head 11—a rotational movement (y) about column 14, a linear movement along an horizontal axis (x), and a rotational movement around a vertical axis theta-z. Together with the vertical movement provided by the column assembly 14, these movements give the possibility of positioning the test head 11 among a plurality of positions located all around column assembly 14. The orientating means 16 provides two additional movements of the test head—a rotational movement about a horizontal axis theta-x, and a rotational movement about an axis theta-y.

Figure 2:
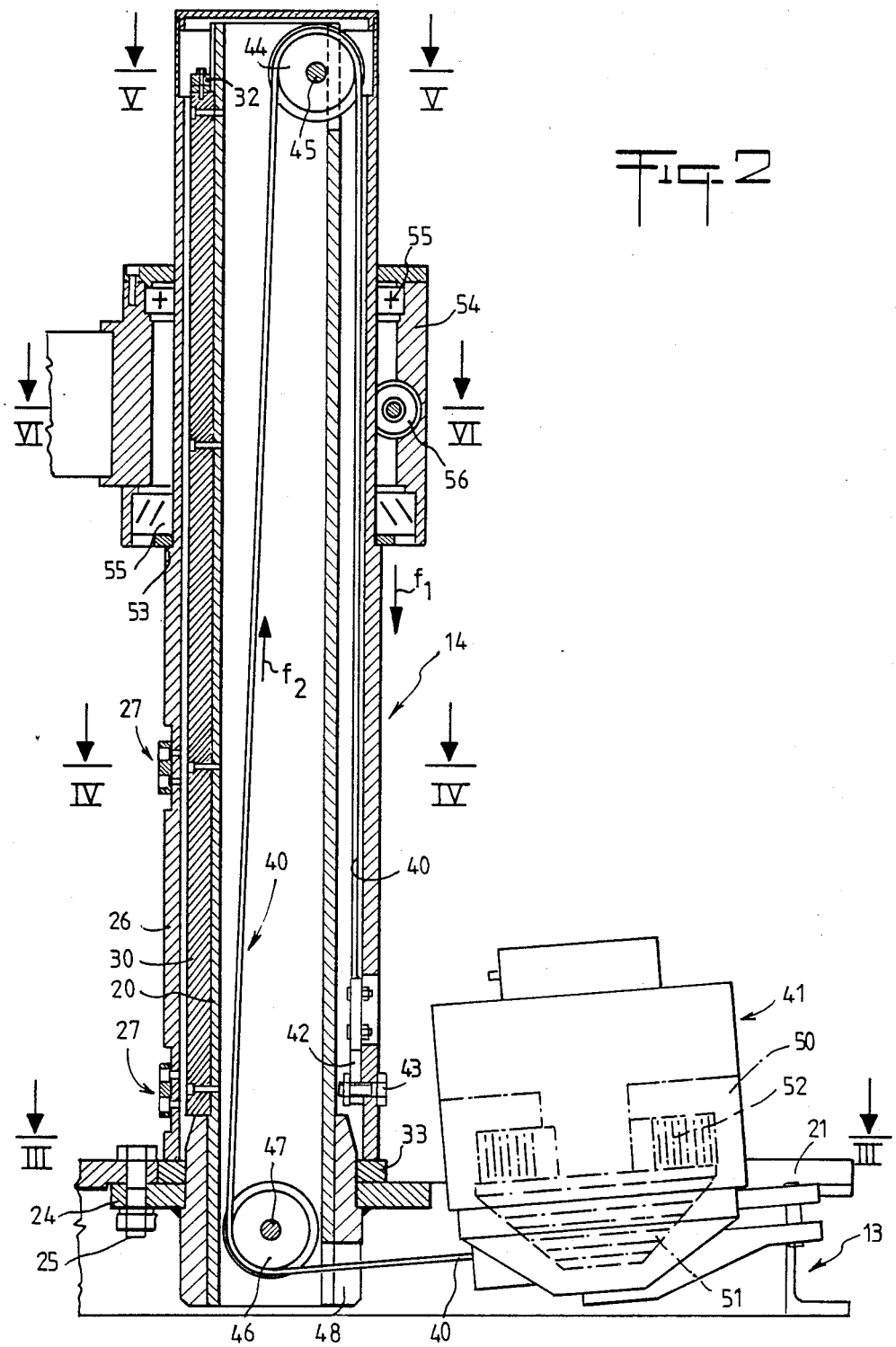
FIG. 2 is an elevational sectional view of the column assembly and of the counterbalancing system of the manipulator apparatus of FIG. 1.
Figure 3:
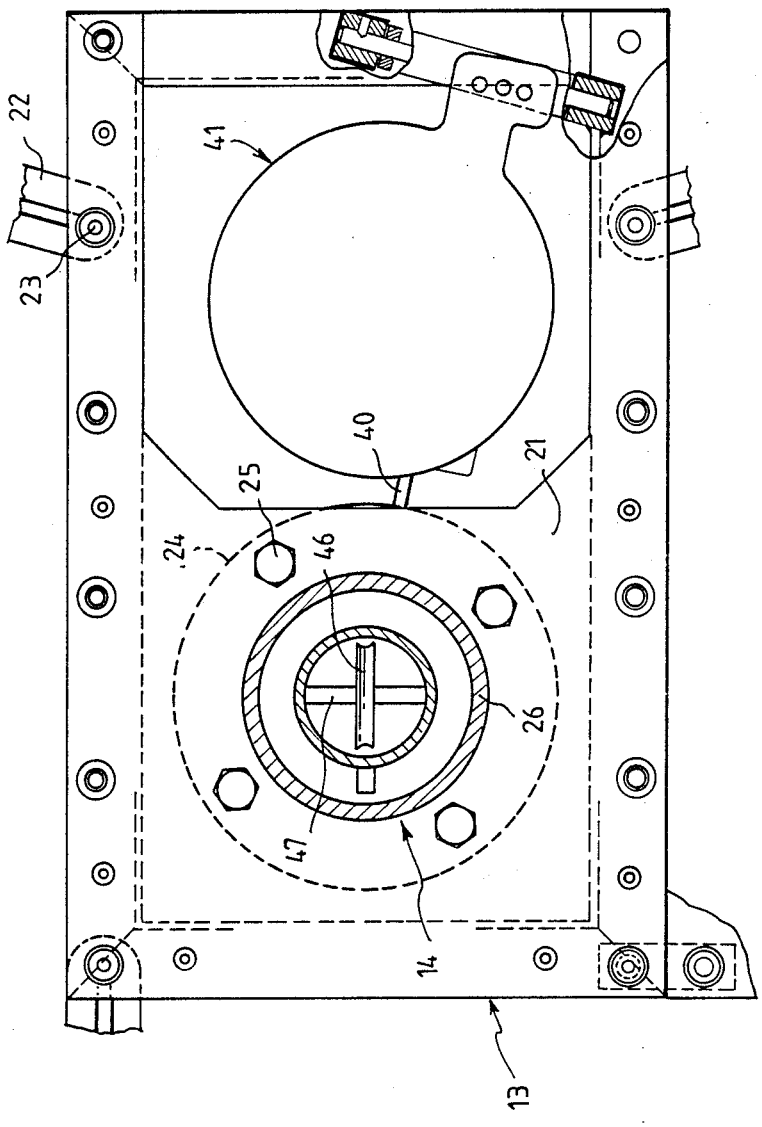

The column assembly 14 comprises a first column member or vertical tubular shaft 20 fixed to the base 13. As best seen in FIGS. 2 and 3, the base 13 comprises a base plate 21 of any appropriate geometrical shape, associated with legs 22 capable of being rotated about vertical hinge axes 23. The legs 22 are shown in part only in FIGS. 1 and 3. They may be made in any appropriate manner and their length may be fixed or adjustable.

As can be seen in FIG. 2, the tubular shaft 20 is fixed by any appropriate means to the base plate 21. Preferably, the shaft 20 has a bottom flange 24 which is fixed to the base plate 21 by means of bolts 25.

The column assembly 14 further comprises a second column member or tubular sheath 26 fitted coaxially over the shaft 20 and mounted for vertical movement with respect to the shaft 20 by guide means 27 and centering means 28, which are shown in greater detail in FIG. 4.

The guide means 27 prevent the tubular sheath 26 from rotating about the tubular shaft 20. The guide means 27 comprises an axial blade 30 which is fixed to the periphery of the fixed tubular shaft 20 and at least two pairs of wheels 31 carried by the sheath 26, each pair of wheels 31 engaging the opposite side faces of the axial blade 30. The two pairs of wheels 31 are spaced apart vertically, from the bottom end of the tubular sheath 26, and co-operate with the major portion of the length of the blade 30, to prevent rotation of the sheath 26 with respect to the shaft 20 for any position of the sheath during its vertical movement. The fully extended position of the sheath 26 relative to the shaft 20 is determined by an abutment 32 (FIG. 5) fitted to the top end of the blade 30 in order to prevent further displacement of the top pair of wheels 31. The fully retracted position, as shown in FIG. 2, is determined by bringing the bottom end of the sheath 26 into abutment against the base plate 21, either directly, or else via an interposed lining 33 for supporting and shock-absorbing purposes, e.g. made of elastomer.

The centering means 28 comprises wheels 34 mounted on forks 35 carried by the sheath 26 to enable them to roll axially on the outside surface of the shaft 20. The wheels 34 are organized in two series which are spaced apart axially, by an amount corresponding to the distance between the two pairs of wheels 31, for example. Within each series, the wheels 34 are disposed at an equidistant angular spacing. FIG. 4 shows that, in preferred manner, each series comprises four wheels 34 organized in diametrically opposite pairs. There are various different ways in which the forks 35 may be made. One suitable structure comprises a flange which is fixed to the outside surface of the sheath 26, the fork 35 and the wheels 34 being mounted from the exterior through the wall of the sheath. The sheath 26 is thus guided both axially and angularly while remaining centered on the shaft 20 along which it can be displaced with minimum friction by virtue of the wheels 31 and 34. The sheath 26 may thus be placed in its retracted position corresponding to the minimum height of the column assembly 14 as shown in FIG. 2. However, the sheath 26 may also be easily raised to its fully extended position by telescopic sliding until it comes into a position fixed by abutment between the top pair of wheels 31 and the abutment 32. In order to obtain a smooth sliding the positions of at least some of the wheels 31 and 34 are adjustable by mounting their axles on adjustable eccentering rings.

The manipulator apparatus comprises a system for counterbalancing the weight of the positioning means and of the test head mounted thereon. The sheath 26 is connected by a flexible transmission to an adjustable force generator, viz. pulling means 41, carried by the base plate 4. The flexible transmission comprises a cable 40 having an end eyelet 42 fixed over fixing means 43 inside the sheath 26 near the bottom end thereof. The cable 40 runs up in the annular gap between the sheath 26 and the shaft 20 and then passes over a pulley 44 mounted for rotation about a horizontal axle 45 at the top of the shaft 20. Beyond the pulley 44, the cable extends axially inside the shaft 20 and passes over a bottom pulley 46 mounted for rotation about a horizontal axle 47 fixed to the base of the shaft 20. Beyond the bottom pulley 46, the cable 40 extends substantially horizontally through a slot 47 in the shaft 20 and is taken up by the pulling means 41.

The pulling means 41 applies an adjustable biasing traction force to the cable 40. The pulling means 41 comprises a housing 50 fixed to the base 13 and containing a drum 51 having a helical groove of progressively increasing spiral diameter on which the cable 40 is spooled. When the sheath 26 is fully raised, the cable 41 is wound over the whole length of the helical groove of drum 51. In the housing 50 the pulling device 41 also includes a spiral spring 52 having one end attached to the drum 51. The angular position of the other end of the spiral spring 52 can be adjusted manually with respect to the housing, by an external control lever. Depending on the weight of the test head, the pulling means 41 is adjusted, in such a manner that the traction of the spring brings the test head vertically to a desired neutral point where the force applied to cable 40 compensates the weight of the test head and the positioning means 15, this weight being applied to the cable 40 in the direction of arrows f1 and f2.

The drum 51 is designed to compensate the variations of the force applied by helical spring 52 when the cable 40 is spooled on or unspooled from this drum 51. Consequently, the force applied by the pulling means 41 is substantially constant for a limited range of vertical positions of the sheath 26 above and below the neutral point. The test head can be moved manually within this limited range of vertical positions to bring the test head to the precise desired vertical position.

At a distance from its top end, the sheath 26 includes an upwardly directed shoulder 53 on which a support ring 54 is rotatably mounted by means of two ball or roller bearings 55. The ring 54 can thus turn freely with minimum friction relative to the sheath 26 through an angle of 360 degrees. An angle locking mechanism 56 (FIG. 6) of any appropriate type is mounted in the ring 54 to lock the ring on the sheath 26. The mechanism 56 preferably comprises a cylindrical sleeve 58 fixed through the wall of the ring 54. Two nuts 57 are mounted for axial movement in the sleeve 58 and are screwed on oppositely threaded portions of a control rod 60 provided with a rotary control knob 61. The sleeve 58 has an opening in the middle part thereof so that a portion of sheath 26 project into the sleeve 58 to enable the nuts 57 to engage the sheath 26 when they are urged axially towards each other inside the sleeve 58 by appropriate rotation of the rod 60. The mechanism 56 can be used to lock the ring 54 very accurately in any angular position around the sheath 26.

The ring 54 comprises a laterally extending portion 62 which is preferably diametrically opposite to the locking mechanism 56 and which carries a body 63 for guiding a horizontal arm 64 supporting the electronic test head. The guide body 63 defines at least one horizontal and preferably two horizontal slideways 65 disposed parallel and one above the other offset from the axis of the column assembly. The slideways 65 support and guide two sliding bars 66 forming the arm 64. At one of their ends, the sliding bars 66 are interconnected by a U-shaped support body 70 on which the orientating means 16 is hinged for supporting the electronic test head. The guide body 63 is provided with at least one mechanism 72 (FIG. 6) for axially locking the arm 64. The mechanism 72 may be constituted by a split flange 73 associated with a screw type clamping member 74 and having at least one of the sliding bars 66 passing therethrough. When the screw 74 is tightened, the split flange 73 is closed, thereby clamping the sliding bar 66 and locking it axially relative to the body 63.

The above-described column assembly 14 has a relatively small vertical extended length due to the fact that the assembly comprises a fixed tubular shaft 20 and a sheath 26 telescopically mounted thereon. The vertical movement of the sheath 26 enables the support ring 54 to be placed anywhere between a lower position as shown in FIG. 2 via any intermediate position up to an upper position where the sheath 26 is extended relative to the shaft 20 to come into contact with the abutment 32.

The ring 54 enables the arm 64 to be pointed in any angular position over a range of 360 degrees around the vertical axis of the column assembly 14.

The lateral arrangement of the guide body 63 offset from the vertical axis of rotation of the ring 54 results in easy displacements of the arm 64 thereby facilitating the handling of the test head.

The use of a cantilevered arm 64 which is preferably constituted by two sliding bars situated in a common vertical plane gives a relatively short and rigid configuration, able to handle heavy heads with very low efforts from the operator.

The relatively compact pulling device 41 which can apply an adjustable compensated traction force to support the weight of the test head allows the user to perform adjustments easily and continuously as a function of the weight of the test head without requiring handling cumbersome and heavy counter weights.

Referring to FIGS. 7 and 8, the U-shaped support body 70 which is attached to the sliding bars 66 comprises upper and lower tines 80 having each a cylindrical opening for rotatably receiving a block 81. The block 81 comprises two stub axles 82 which are rotatably mounted by means of ball or needle bearings in the openings of tines 80 to define a vertical axis of rotation theta-z, generally parallel to the axis of the column assembly 14. Rotation between the support body 70 and the block 81 may be locked by means of angular locking means 83 which are manually controlled. The locking means 83 may, for example, comprise a split flange 84 fixed on the upper tine 80 of the body 70 in order to surround an extension 85 of the top stub axle 82. The flange 84 is associated with a clamping member 86 capable of opening or closing the flange in order to angularly release or to angularly lock the extension 85 of the stub axle 82 which is fixed to or part of the block 81.

The orientating means 16 comprises an annular frame 90 which is provided on its outside with a cylindrical tail 91 extending radially and rotatably mounted via ball bearings 92 in a bore 93 in the block 81 about an axis of rotation theta-x extending substantially horizontally and intersecting the axis theta-z. The block 81 carries means 94 which will be described hereafter, for adjusting and maintaining the angular position of the annular frame 90 about the axis theta-x.

The annular frame 90 comprises two parallel rings 95 and 96 (FIG. 8) containing centering means 97 therebetween, which are constituted by rollers mounted to rotate freely on spacers 98. The centering means 97 are provided to support and center a circular disk 100 for rotation about an axis theta-y, which is the geometrical axis of the annular frame 90. The rollers 97 are preferably in the form of waisted (or necked) cylinders which fit over the complementary peripheral edge of the disk 100. For example, the disk 100 which is intended for supporting the electronic test head 11 includes means 101 in its center for receiving and fixing the radially extending arm 12 of the test head, together with windows 102 for passing and/or containing electrical connectors coming from the test head 11.

In order to facilitate assembling and/or interchanging the disk 100, the annular frame 90 preferably comprises a first arcuate portion 90a which extends from a fork 103 fixed to the tail 91. The fork 103 is provided with a pivot axis 104 disposed parallel to the axis of rotation theta-y. The axis 104 supports a second arcuate portion 90b pivotally mounted in the plane of FIG. 7 between an open position relative to the arcuate portion 90a in which it leaves an open space which is sufficient to take off disk 100 from the annular frame 90, and a closed position in which it builds up a complete circle in conjunction with arcuate portion 90a. The arcuate portion 90a and 90b are connected together by connecting means 105 (see also FIG. 9), which comprises, for example, a pin 106 rotatably mounted between the two half rings constituting the arcuate portion 90a, a radial threaded rod 107 which extends from pin 106 for engaging a fork 108 attached to arcuate portion 90b and a clamping nut 109 threaded on rod 107 for pressing arcuate portion 90b against arcuate portion 90a.

Each of the arcuate portions 90a and 90b is constituted by two interassembled half-rings, as mentioned above, to form annular frame 90 when the arcuate portions are locked to each other by the connecting means 105.

The annular frame 90 is provided with locking means 110 for locking the angular position of the disk 100 about its axis of rotation theta-y The locking means 110 may comprise, for example, a pressure screw 111 passing through a fixed nut 112 carried by the ring 90 so as to bear in a radial direction against the peripheral edge of the disk 100. Naturally, other technical means could be used for providing the same function.

As mentioned before, the apparatus comprises adjustment means 94 to adjust and maintain the angular position of the annular frame 90 about the axis theta-x in the block 81. The adjustment means 94 comprise a split flange 115, which is fixedly mounted on a cylindrical bearing surface 116 formed on the block 81 concentrically about the axis theta-x of the bore 93. The split flange 115 is locked on the bearing surface 116 by means of a screw 117 passing through the two branches of said flange on either side of the gap therein.

At the opposite end to the screw 117, the flange 115 carries a shaft 118 on which an eccentric camming member 119 is mounted free to rotate. The eccentric member 119 is extended by an operating handle 120 and has a peripheral camming surface engaging a plate 121 fixed to the fork 103 of annular frame 90.

Figure 10:
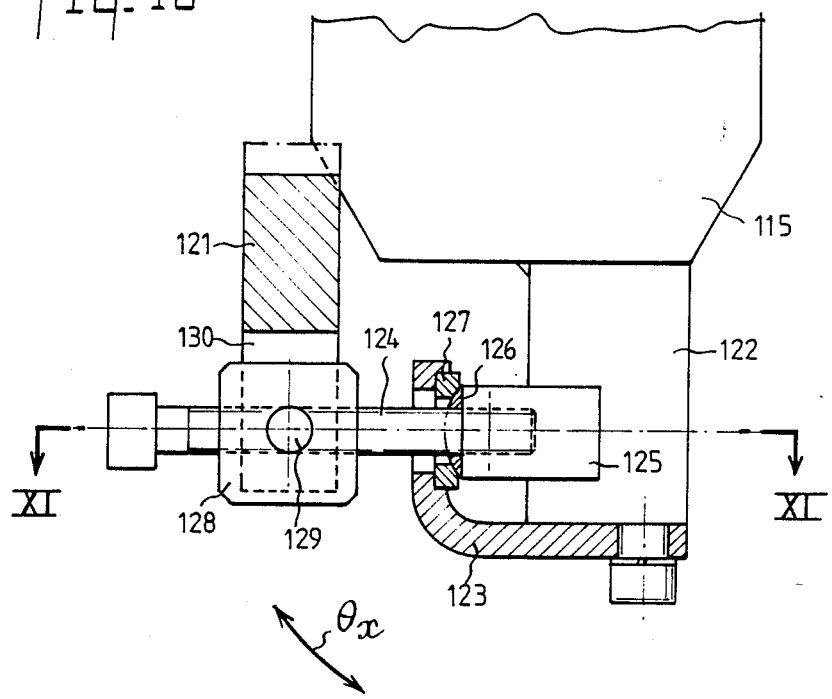
FIG. 10 is a partial elevation section on a larger scale showing a second embodiment of adjustment means of the manipulator apparatus.
Figure 11:
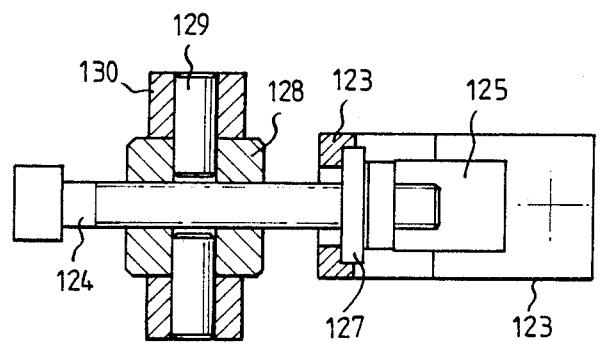
FIG. 11 is a sectional view taken on line XI—XI of FIG. 10.

In a second embodiment of the adjustment means shown in FIGS. 10 and 11, the flange 115 includes a downwardly extending portion 122 carrying a L-shaped abutment strip 123 having an opening through which a screw 124 passes freely. One end of the screw 124 is fixed to a nut 125 having an internal cap 126 with a spherical bearing surface received in a complementary seat 127 bearing on the abutment strip 123. Ahead of the abutment strip 123 the screw 124 is threaded in a nut 128 pivotally mounted by stub axles 129 running parallel to the axis theta-x of the bore 93 on a fork 130 fixed to the plate 121 or to another part carried by the fork 103.

With any of these embodiments, the user can proceed with angular adjustment of the position of the annular frame 90 around axis theta-x with the test head attached while preventing said annular frame 90 from tilting about said horizontal axis theta-x under effect of the unbalanced weight of the test head. This adjustment is limited to a given range of positions of the annular frame 90 about axis theta-x. In the embodiments described the adjustment means 94 were designed to provide a rotation of axis theta-y around axis theta-x from −5 degrees to +5 degrees from a horizontal position of axis theta-y.

As can be seen from the foregoing description, the apparatus includes orientating means 16 which is particularly suitable for supporting an asymmetrical type electronic test head including a radially extending arm which is received by the disk 100. Such a head (as can easily be seen in FIG. 1) can thus easily be fixed in a cantilevered position so that its radial arm 12 is in alignment with the axis of rotation theta-y about which the head 11 can be oriented by at least 180 degrees in a manner which is simple and easy by rotating the disk 100. The disk 100 can be locked angularly using the locking means 110.

The head 11 can also be adjusted and oriented about the axis of rotation theta-x for a limited amount of movement by rotating the frame 90 about said axis, i.e. about the tail 91 by the adjustment means 94.

The manipulator apparatus in accordance with the invention thus makes it possible, in a manner which is practical, quick, and effective, to support an asymmetrical type head having a radially extending arm in a cantilever arrangement while ensuring that said head can be moved manually with the required degrees of freedom.

It will be noted here that except the adjustment means 94, all the locking mechanisms 56, 72, 83 and 110 can be released to position the head 11 manually and dock it with a device handler. The locking mechanisms can also be released after docking the head to the device handler. The head then remains in position without being subjected to stresses from the manipulator.

The invention is not limited to the examples described and shown, and numerous modifications may be applied without going beyond the scope of the invention.

What is claimed is:

1. A manipulator apparatus for supporting and orienting a test head, comprising:
   a base having a first vertical structure fixed thereon;
   a second vertical structure mounted for vertical movement relative to said first vertical structure and having at least a portion with a vertical axis;
   a support member mounted on said second vertical structure for rotation about said vertical axis, said support member being adapted to support said test head; and
   counterbalancing means for applying an upwardly directed force to said second vertical structure in order to support the weight of said second vertical structure, said support member, and said test head, said counterbalancing means including cable means having one end attached to said second vertical structure, and pulling means attached to said base for applying an adjustable spring biasing force to the other end of said cable means, said pulling means comprising:
   a case attached to said base;
   drum means rotatably mounted in said case for spooling said cable means;
   adjustable spring means attached to said drum means for applying an adjustable biasing force to said drum means to spool said cable means on said drum means; and
   compensating means for compensating the variations of said biasing force for a range of angular positions of said drum means, so that the weight of the test head is substantially counterbalanced for a range of vertical position of said test head without changing the adjustment of the biasing force.

2. The apparatus of claim 1 wherein said first vertical structure comprises a first tubular member and said second vertical structure comprises a second tubular member mounted telescopically and coaxially with said first vertical axis with respect to said first tubular member.

3. The apparatus of claim 2 further comprising means for preventing rotation of said second tubular member with respect to said first tubular member about said vertical axis.

4. The apparatus of claim 2 further comprising wheel means for guiding said second tubular member along said first tubular member during vertical movement of said second tubular member, said wheel means being mounted on said second tubular member for rotation about horizontal axes and engaging the peripheral surface of said first tubular member.

5. The apparatus of claim 2 wherein said counterbalancing means further comprises cable guiding means for guiding said cable means along a path comprising a first portion extending upwardly from a lower portion of said second tubular member between said first and second tubular members, a second portion extending downwardly through said first tubular member, and a third portion extending out of said first and second tubular members towards said pulling means.

6. The apparatus of claim 5 wherein said cable guiding means comprises a first pulley rotatably mounted about a horizontal axis on an upper portion of said first tubular member and a second pulley rotatably mounted about a horizontal axis on a lower portion of said first tubular member.

7. The apparatus of claim 1 wherein said compensating means comprises a drum with a surface of progressively varying diameter, said cable means being spooled on said varying diameter surface of said drum.

8. A manipulator for manually positioning an object in space and maintaining the position, comprising:
   a base;
   a first vertical structure mounted on said base;
   a second vertical structure in engagement with said first vertical structure and moveable relative thereto along a vertical axis from a fully retracted position in which the respective upper regions of said first and second vertical structures are at substantially the same level, to a fully extended position in which the upper region of said first vertical structure and the lower region of said second vertical structure are at substantially the same level;
   an object support arm connected to said second vertical structure and adapted to receive said object;
   an adjustable bias force generator mounted in said base and comprising:
      a case attached to said base;
      a drum rotatably mounted in said case and having a surface of progressively varying diameter; and
      an adjustable spring attached to said drum for applying a selected biasing force to said drum; and
   a mechanical linkage for transmitting the force from said bias force generator to a lower region of said second vertical structure in opposition to the weight of said second vertical structure, said support member, and said object, the magnitude of said force being selected to counterbalance the weight of said second vertical structure, said support member, and said object, said mechanical linkage including a cable section adapted for spooling on said varying diameter surface of said drum.

9. An apparatus as in claim 8 wherein said first vertical structure comprises a first tubular member and said second vertical structure comprises a second tubular member mounted telescopically and coaxially with said first vertical axis with respect to said first tubular member.

10. An apparatus as in claim 9 wherein said object support arm rotatably engages said second tubular member for rotation about said vertical axis in a upper region thereof, and wherein said apparatus further comprising means for preventing rotation of said second tubular member with respect to said first tubular member about said first vertical axis.

11. An apparatus as in claim 8 wherein said linkage comprises:
   a cable having one end connected to the lower region of said second vertical structure and the other end connected to said force generator; and
   a guide system for guiding said cable along a path comprising a first segment between the lower portion of said second vertical structure and the upper portion of said first vertical structure, a second segment between the upper portion of said first vertical structure and the lower portion of said first vertical structure, and a third segment between the lower portion of said first vertical structure and said force generator.

* * * * *